INTEGRATED CRYSTAL CIRCUITS AND THE METHOD OF MAKING THEREOF

Filed Jan. 13, 1967

INVENTOR.
ER-CHUN HO,
BY
Victor Sepulveda
AGENT.

United States Patent Office 3,416,036
Patented Dec. 10, 1968

3,416,036

INTEGRATED CRYSTAL CIRCUITS AND THE METHOD OF MAKING THEREOF

Er-Chun Ho, Newport, Calif., assignor to Hughes Aircraft Company, Culver City, Calif., a corporation of Delaware Filed Jan. 13, 1967, Ser. No. 609,048
5 Claims. (Cl. 317—101)

ABSTRACT OF THE DISCLOSURE

A cut quartz crystal resonator having integrated microminiature electric circuits and components either deposited or bonded thereon.

This invention relates to microminiature circuit techniques and more particularly to microminiature circuits which include a combination of a crystal resonator having an integrated circuit of thin film or thick film deposited on the quartz crystal wafer thereof, or the like, and the method of making thereof.

In the techniques of microminiaturizing electronic circuits, complete electrical circuits are normally deposited upon a ceramic or similar substrate. One of the major difficulties in fabricating these circuits is that inductive devices, such as coils, or the like, cannot easily be formed by microminiature techniques. In order to design circuits which perform functions requiring inductive devices such as filters and oscillators, the AT-cut quartz crystal may be used to perform the resonance or other functions while still maintaining the microminiaturization. Such quartz crystal resonators are well known in the art and are formed by placing two electrodes on opposite sides of a crystal wafer and applying an electric field thereto. Such a device using this concept can be best understood by referring to text books, e.g. Quartz Crystals for Electrical Circuits, R. A. Heising, author, published by D. Van Nostrand Co., 1946 and to co-pending patent application Crystal Filter Array, S.N. 484,899, filed on Sept. 3, 1965, on behalf of E. C. Ho, which is assigned to the same assignee as the present invention.

Many attempts have been made to deposit piezoelectric resonators to a microelectronic substrate to form a resonance circuit element in microelectronic circuits such as oscillator, filter network, etc. Heretofore this technique has not been successful because the resonant frequency Q obtained in the deposited crystal resonator is too low to perform as a useful device, and thus no practical technique has been found to deposit quartz crystal on a substrate.

By this invention is has been found that microelectric circuit components can be deposited upon the crystal wafer of the resonator. These components can then be arranged into circuit configurations to form the oscillators, or amplifier circuits, or other type circuits which use crystal resonators. By this technique, microminiaturization is accomplished to form certain desired circuits which have heretofore required extraneously coupled inductive components such as a coil.

It therefore becomes one object of this invention to construct microminiaturized electronic circuits which normally require inductive devices.

Another object of this invention is to provide a quartz crystal resonator with integrated circuitry disposed upon the crystal wafer of the quartz crystal resonator.

Another object of this invention is to provide a crystal filter and a crystal oscillator which include the integrated associated circuitry in a smaller size than heretofore attainable.

These objects, as well as other objects, features and advantages, will become readily apparent from the following detailed description of preferred embodiments of the invention when taken into consideration with the accompanying drawings in which.

Figure 2:
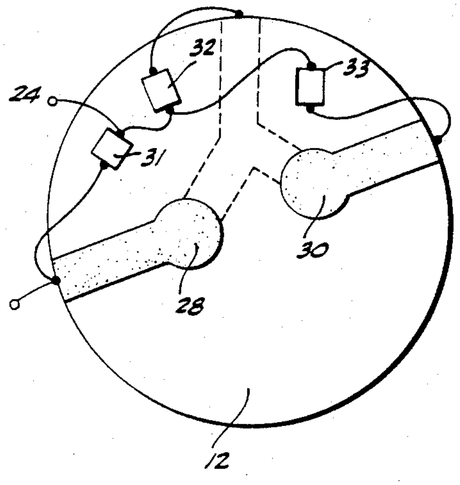
FIGURE 2 is a second embodiment of this invention wherein a crystal filter circuit is deposited directly upon the crystal wafer.
Figure 2A:
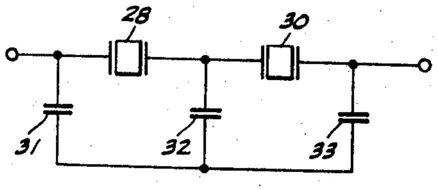
Figure 3:
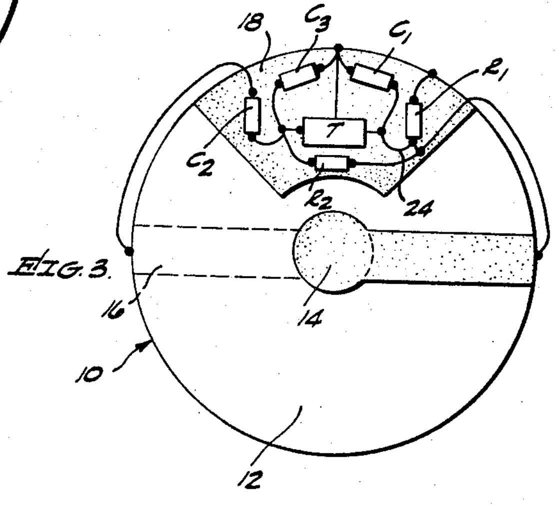
Figure 4:
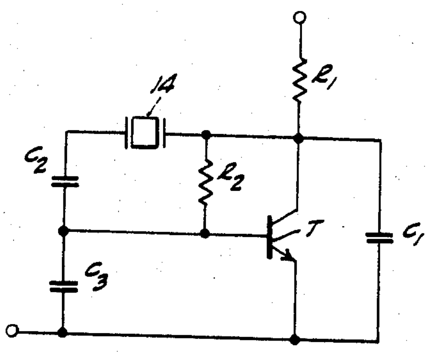

FIGURE 2*a* is a schematic drawing of the embodiment shown in FIGURE 2;

FIGURE 3 illustrates a further embodiment of this invention which features a specific circuit forming a crystal oscillator circuit deposited upon the crystal wafer; and FIGURE 4 is a schematic drawing of the circuit configuration of FIGURE 3.

Figure 1:
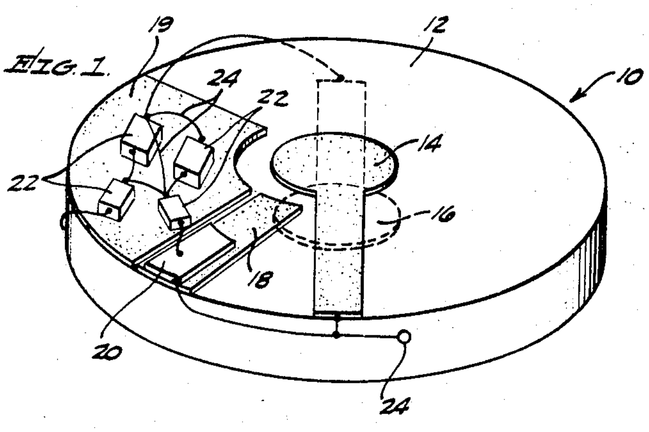
FIGURE 1 is a perspective drawing of a preferred embodiment of this invention illustrating a quartz crystal resonator with the integrated circuitry disposed thereon.

Turning now to a more detailed description of this invention, there is shown in FIGURE 1 a typical quartz crystal resonator 10 which includes a crystal wafer 12 which is composed of a piezoelectric crystal such as an AT-cut crystal. In this embodiment a single pair of electrodes 14 and 16 are deposited on either side of the crystal wafer 10 to form the crystal resonator. These particular techniques are well known in the art and can be further understood by reference to the above-mentioned textbook and co-pending patent applications and will not be further discussed herein.

In the embodiment shown in FIGURE 1 a metallic surface 18 and 19 such as chrome, gold, aluminum or the like may be deposited by the thin film vapor deposition method directly upon the crystal wafer 12, the choice depending upon whether a polished or non-polished surface is used. This becomes necessary in some respects for depositing other later-to-be-described material which do not easily adhere to the crystal material. A thin film resistor, or capacitor, or other passive type material such as indicated by the numeral 20 may be deposited in a similar technique directly upon the metal surface 18. It may also be necessary in some configurations to passivate metallic surface 20 to protect the surface of the passive elements.

Active components such as indicated by the numeral 22, such as chip transistors, diodes, or other active devices, may be bonded by glue or cement to metal surface 19.

A circuit can then be completed by connecting desired leads 24 and thereby couple together all of the integrated circuit components with the electrodes 14 and 16 of the crystal resonator to form the desired circuit.

FIGURE 2 represents a fully integrated crystal filter circuit with two crystal resonators, 28 and 30, and three thin film capacitors, 31, 32 and 33, forming a two $\pi$ section network. The passive elements are deposited on the crystal wafer 12 in the same manner as described in connection with FIGURE 1. The equivalent electrical circuit is shown in FIGURE 2*a*.

Referring now to FIGURES 3 and 4, there is shown a crystal oscillator constructed in the manner as described in this invention. Passive elements, such as three capacitive elements C1, C2 and C3, and a pair of resistive elements R1 and R2 are affixed to metallic surface 18. This may be accomplished by a thin film vapor deposition process which is well known in the art. The active device in this circuit is a transistor T which is bonded to the metallic surface 18. It is not desirable to "grow" the active device upon the surface of the crystal 12 because the high temperature required may cause deterioration to the crystal 12. All of these components are coupled together by extraneous leads 24 to form the circuit as shown in FIGURE 4 which is a simple crystal oscillator circuit and the operation thereof will not be explained herein.

As can be seen by this embodiment, external leads 24 are shown as interconnecting wires. It is also possible to accomplish this same interconnection by depositing the leads directly to the crystal substrate 12.

Having thus described one embodiment of this invention, what is claimed is:

1. An integrated electrical circuit comprising:
a quartz crystal resonator device, said device including a crystal wafer substrate; and
a plurality of electrical circuit elements forming a desired circuit configuration disposed on said crystal wafer substrate and electrically intercoupled with said resonator.

2. The circuit as defined in claim 1 wherein the circuit elements are affixed to the surface of said crystal wafer substrate.

3. An integrated electrical circuit comprising:
a cut quartz crystal substrate;
a pair of electrode means disposed on either side of said crystal substrate for forming an electrical resonator thereof;
a metallic surface disposed on a selected portion of said substrate;
a plurality of electrical circuit elements selected ones of said elements being disposed directly on said crystal substrate and the remainder of said elements being disposed on said metallic surface; and means intercoupling said plurality of electrical circuit means to form a desired circuit.

4. The integrated circuit as defined in claim 3 wherein said metallic surface is passivated and further comprising passive integrated circuit elements vapor deposited on said metallic surface.

5. The integrated circuit as defined in claim 4 and further including active integrated circuit elements which are bonded to the crystal substrate.

References Cited

UNITED STATES PATENTS

| | | | |
|---|---|---|---|
| 3,310,711 | 3/1967 | Hangstefer | 317—101 |
| 3,328,609 | 6/1967 | Clicques | 331—116 |
| 3,258,244 | 12/1967 | Ho et al. | 331—116 |

FOREIGN PATENTS

| | | |
|---|---|---|
| 154,889 | 6/1963 | U.S.S.R. |

LEWIS H. MYERS, *Primary Examiner.*

J. R. SCOTT, *Assistant Examiner.*

U.S. Cl. X.R.

331—116